US009496255B2

(12) United States Patent
Zuo et al.

(10) Patent No.: US 9,496,255 B2
(45) Date of Patent: Nov. 15, 2016

(54) STACKED CMOS CHIPSET HAVING AN INSULATING LAYER AND A SECONDARY LAYER AND METHOD OF FORMING SAME

(75) Inventors: Chengjie Zuo, San Diego, CA (US); Changhan Yun, San Diego, CA (US); Sang-June Park, San Diego, CA (US); Chi Shun Lo, San Diego, CA (US); Mario F. Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 357 days.

(21) Appl. No.: 13/356,717

(22) Filed: Jan. 24, 2012

(65) Prior Publication Data
US 2013/0120951 A1 May 16, 2013

Related U.S. Application Data

(60) Provisional application No. 61/560,471, filed on Nov. 16, 2011.

(51) Int. Cl.
*H01L 21/00* (2006.01)
*H01L 27/06* (2006.01)

(52) U.S. Cl.
CPC .................. *H01L 27/0688* (2013.01)

(58) Field of Classification Search
CPC ............. H01L 2224/01; H01L 2224/28; H01L 2224/28105; H01L 2224/29; H01L 2224/30; H01L 2224/3001; H01L 2224/31–2224/33; H01L 27/0688

USPC ................. 438/106–110, 113, 118; 257/686, 257/E21.505, E21.506, E25.013; 361/783
See application file for complete search history.

(56) References Cited

U.S. PATENT DOCUMENTS

| 6,399,997 | B1 | 6/2002 | Lin et al. |
| 7,659,582 | B2 | 2/2010 | Droes et al. |
| 7,943,423 | B2 | 5/2011 | Pohl et al. |
| 2003/0034497 | A1 | 2/2003 | Yamazaki et al. |
| 2005/0006647 | A1 | 1/2005 | Utsunomiya |
| 2005/0023656 | A1 | 2/2005 | Leedy |
| 2007/0207592 | A1 | 9/2007 | Lu et al. |

(Continued)

FOREIGN PATENT DOCUMENTS

| JP | 2001102523 A | 4/2001 |
| JP | 2003100450 A | 4/2003 |

(Continued)

OTHER PUBLICATIONS

International Search Report and Written Opinion—PCT/US2012/065644—ISA/EPO—Jan. 31, 2013.

(Continued)

*Primary Examiner* — Shaun Campbell
(74) *Attorney, Agent, or Firm* — Michelle S. Gallardo

(57) ABSTRACT

A chipset includes a sheet of glass, quartz or sapphire and a first wafer having at least one first circuit layer on a first side of a first substrate layer. The first wafer is connected to the sheet such that the at least one first circuit layer is located between the first substrate layer and the sheet. A second wafer having at least one second circuit layer on a first side of a second substrate layer is connected to the first substrate layer such that the at least one second circuit layer is located between the second substrate layer and the first substrate layer. Also a method of forming a chipset.

25 Claims, 3 Drawing Sheets

(56) References Cited

U.S. PATENT DOCUMENTS

| | | |
|---|---|---|
| 2007/0228383 A1 | 10/2007 | Bernstein et al. |
| 2008/0128901 A1* | 6/2008 | Zurcher .............. B81C 1/00238 257/724 |
| 2008/0149832 A1* | 6/2008 | Zorn ............................ 250/311 |
| 2009/0149023 A1* | 6/2009 | Koyanagi ..................... 438/666 |
| 2010/0155932 A1* | 6/2010 | Gambino ............ G06F 17/5068 257/698 |
| 2010/0264551 A1 | 10/2010 | Farooq et al. |
| 2010/0330779 A1* | 12/2010 | Okuno .................... H01L 21/84 438/458 |
| 2013/0087926 A1* | 4/2013 | Pelley et al. .................. 257/774 |

FOREIGN PATENT DOCUMENTS

| | | |
|---|---|---|
| JP | 2004165269 A | 6/2004 |
| JP | 2004349513 A | 12/2004 |
| JP | 2009067098 A | 4/2009 |

OTHER PUBLICATIONS

Zhang, Q.X. et al., "Integration of RF MEMS and CMOS IC on a Printed Circuit Board for a Compact RF System Application Based on Wafer Transfer." Electron Devices, IEEE Transactions on Issue Date: Sep. 2008 vol. 55 Issue:9 On pp. 2484-2491 ISSN: 0018-9383.

\* cited by examiner

STACKED CMOS CHIPSET HAVING AN INSULATING LAYER AND A SECONDARY LAYER AND METHOD OF FORMING SAME

CLAIM OF PRIORITY UNDER 35 U.S.C. §119

The present Application for Patent claims priority to U.S. Provisional Application No. 61/560,471, entitled "STACKED CMOS CHIPSET HAVING AN INSULATING LAYER AND A SECONDARY LAYER AND METHOD OF FORMING SAME", filed Nov. 16, 2011, and assigned to the assignee hereof and hereby expressly incorporated by reference herein.

FIELD OF DISCLOSURE

The present application for patent is directed toward a chipset having a complementary metal oxide semiconductor (CMOS) layer bonded to an insulator and a second layer stacked on the CMOS layer, and toward a method of forming same, and, more specifically, toward a chipset including a CMOS layer bonded to an insulator and a second layer having passive elements, radio frequency (RF) circuitry or microelectromechanical system (MEMS) elements and toward a method of forming same.

BACKGROUND

As cellular wireless systems evolve from 2G to 4G, there is increasing demand for radio frequency (RF) chipsets to support larger numbers of bands. Providing the chipsets with the ability to handle these additional bands may require adding additional transceivers, filters, power amplifiers, passive components and switches to the chipset front end, and this increases the cost and complexity of the chipsets. The RF system of a cellphone mainly consists of two parts: the transceiver, which is often a single complementary metal oxide semiconductor (CMOS) chip, and the RF front-end (including various on-board components: filters, duplexers, RF switches, power amplifiers and passives). While the CMOS transceiver can be designed to be shared by different bands or modes, generally called a multi-mode/multi-band transceiver design, the front-end part, especially the filters and duplexers, cannot be shared between different bands, simply because they operate in different frequency range. The presence of these additional elements to support more bands/modes may cause the front end to become a limiting factor when attempting to increase performance and reduce size and cost.

Conventional multi-band and/or multi-mode RF chipset front ends may include devices such as RF switches, power amplifiers, acoustic filters and passives, e.g., inductors and capacitors. While the CMOS chip elements generally may scale continuously, resulting in lower cost and smaller size with new technological advances, the front end does not always scale as readily. One approach to this situation has been to integrate multiple chips, e.g., GaAs antenna switches, GaAs power amplifiers, CMOS controllers, surface acoustic wave (SAW) filters, integrated passive devices, etc. onto a single laminate or ceramic substrate. This approach may be referred to as a "system-in-package" solution for front-end integration. There is also interest in addressing the multi-band complexity problem at a system architecture level by introducing a tunable front end. To realize a low-loss multi-band tunable system, a way must be found to implement high-Q tunable passives, such as semiconductor varactors and MEMS-based tunable capacitors, and high-performance RF switches into a single arrangement. Front end integration may also be useful for reducing the overall size and cost of multiband and/or multi-mode RF transceiver chipsets. It would therefore be desirable to provide a chipset that integrates CMOS components with other front end components in a space- and cost-effective manner.

SUMMARY

An exemplary embodiment includes a chipset comprising a sheet of glass, quartz or sapphire, and a first wafer having at least one first circuit layer on a first side of a first substrate layer. The first wafer is connected to the sheet such that the at least one first circuit layer is located between the first substrate layer and the sheet. The chipset also includes a second wafer having at least one second circuit layer on a first side of a second substrate layer, and the second wafer is connected to the first substrate layer such that the at least one second circuit layer is located between the second substrate layer and the first substrate layer.

Another embodiment is a method of forming a chipset that includes providing a first wafer comprising a first silicon substrate and at least one first circuit layer on the first silicon substrate, connecting the at least one first circuit layer to a sheet of glass, quartz or sapphire and then removing a portion of the first silicon substrate. The method also includes providing a second wafer comprising a second silicon substrate and at least one second circuit layer on the second substrate, connecting the at least one second circuit layer to the first silicon substrate and then removing a portion of the second silicon substrate.

A further embodiment includes a chipset having insulator sheet means for supporting a wafer and a first wafer comprising at least one first circuit means for processing signals on a first side of a first substrate layer, where the first wafer is connected to the insulator sheet means such that the at least one first circuit means is located between the first substrate layer and the insulator sheet means. The chipset further includes a second wafer comprising at least one second circuit means for processing signals on a first side of a second substrate layer, and where the second wafer is connected to the first substrate layer such that the at least one second circuit layer is located between the second substrate layer and the first substrate layer.

Another embodiment is a method of forming a chipset that includes steps for providing a first wafer comprising a first silicon substrate and at least one first circuit layer on the first silicon substrate, steps for connecting the at least one first circuit layer to a sheet of glass, quartz or sapphire, steps for then removing a portion of the first silicon substrate, steps for providing a second wafer comprising a second silicon substrate and at least one second circuit layer on the second substrate, steps for connecting the at least one second circuit layer to the first silicon substrate and steps for then removing a portion of the second silicon substrate.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
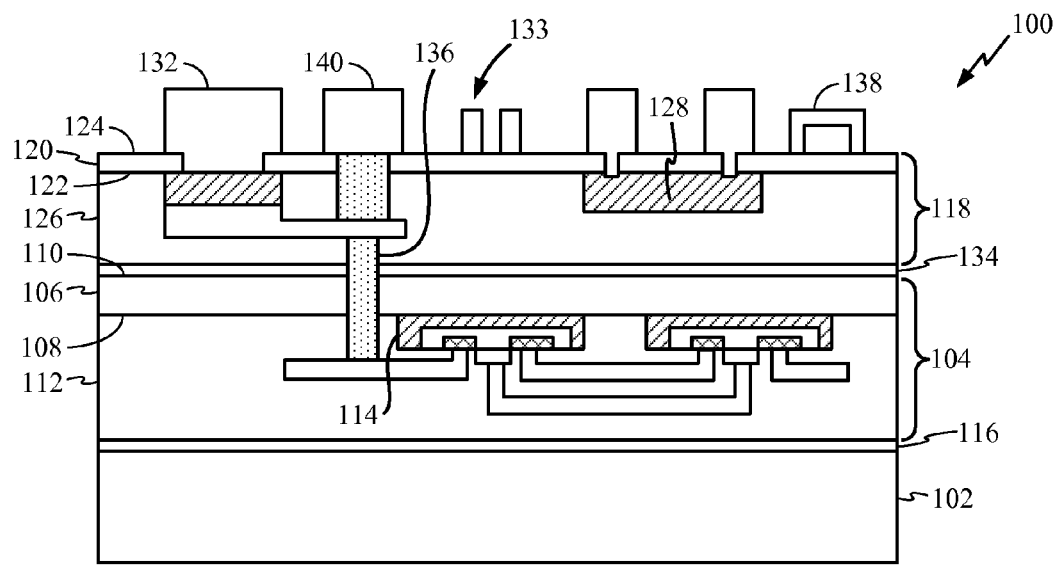
FIG. 1 is a schematic side elevational view of a chipset according to an embodiment.

FIG. 1 illustrates a chipset 100 according to an embodiment. The chipset 100 includes a sheet 102 formed from an insulator such as glass, quartz or sapphire to which a first silicon-on-insulator (SOI) wafer 104 is bonded. The first SOI wafer 104 includes a first substrate layer or first insulating layer 106 having a first side 108 facing the sheet 102 and a second side 110, and the first SOI wafer 104 also includes a first circuit layer 112, which first circuit layer 112 includes a plurality of CMOS transistors 114 on the first side 108 of the first insulating layer 106 and associated wiring. These CMOS transistors 114 and other circuit elements (not illustrated) may comprise circuitry for digital signal processing, application or graphics processors, and/or circuitry for handing baseband signals. The first SOI wafer 104 is bonded to the sheet 102 using a first adhesive layer 116 or other conventional wafer bonding techniques such that the first circuit layer 112 is located between the first side 108 of the first insulating layer 106 of the first SOI wafer 104 and the sheet 102.

A second SOI wafer 118 is connected to the first SOI wafer 104. The second SOI wafer 118 includes a second substrate layer or second insulating layer 120 having a first side 122 facing the second side 110 of the first insulating layer 106 and a second side 124. The second SOI wafer 118 also includes a second circuit layer 126, which second circuit layer 126 includes passive elements or "passives" such as a resistor 128 and a capacitor 132 located partially or entirely within the second circuit layer 126 and an inductor 133 and a MEMS device or sensor 138 located on the second side 124 of the second insulating layer 120. A single resistor 128, capacitor 132, inductor 133 and MEMS device 138 are illustrated in FIG. 1; however, the second SOI wafer 118 may, in some cases, only include one or two of these component types and/or include multiple ones of these individual components (including active circuitry like CMOS transistors). The second SOI wafer 118 is bonded to the second side 110 of the first insulating layer 106 using a second adhesive layer 134 such that the second circuit layer 126 is located between the first side 122 of the second insulating layer 120 and the second side 110 of the first insulating layer 106. Vias 136 electrically connect elements of the second circuit layer 126 to elements of the first circuit layer 112, and suitable metal contacts 140 may be connected at the second side 124 of the second insulating layer 120 to electrically connect elements in or on the second circuit layer 126 and/or the first circuit layer 112 to devices outside the chipset 100.

If a similar chipset were constructed on a high-resistivity Silicon (Si) substrate with buried oxide (as the case in SOI CMOS technology) instead of on the sheet 102 formed from a pure insulator like sapphire, quartz or glass, nonlinear parasitic capacitances would be produced at the interface between the high-resistivity Si and buried $SiO_2$ in the SOI substrate at RF frequencies. These parasitic capacitances result in nonlinearities and power handling issues for RF switches and power amplifiers. The use of the sheet 102 as described herein substantially eliminates the nonlinear-parasitic-capacitance problem and allows CMOS elements such as the CMOS transistors 114 and the passives, which may comprise high-Q passives, to be used together in the same chipset 100 with much better performance than on SOI wafers.

Figure 2:
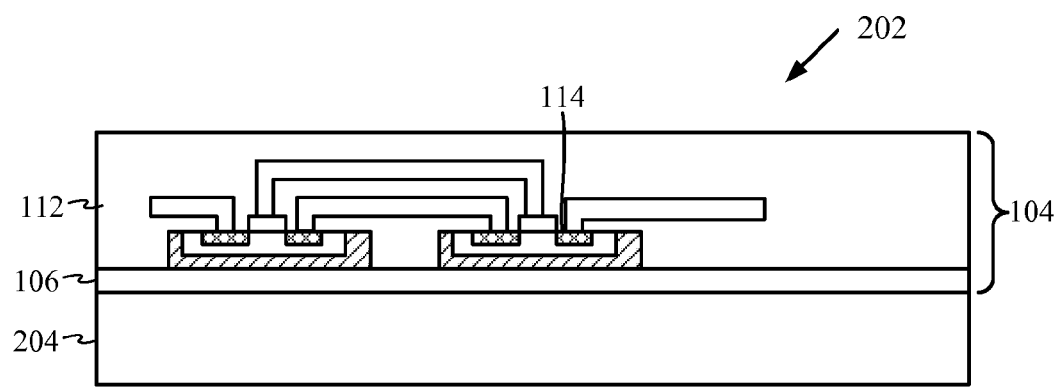
FIGS. 2-7 are schematic side elevational views of stock material and components of the chipset of FIG. 1 showing assembly stages of a method for producing the chipset of FIG. 1.

Various manufacturing stages of the chipset 100 are illustrated in FIGS. 2-7, and elements present in the chipset 100 and discussed in FIG. 1 are identified by the same reference numerals in FIGS. 2-7. FIG. 2 illustrates a first stock SOI wafer 202 that includes a first silicon substrate or handle layer 204 on which the first insulating layer 106 and the first circuit layer 112 are formed. The first stock SOI wafer 202 may comprise a conventional bulk Silicon CMOS wafer to help reduce costs, and in this case, the first substrate layer 106 would not comprise an insulator but instead would be the portion of the bulk Silicon located immediately beneath the elements of the first circuit layer 112.

Figure 3:
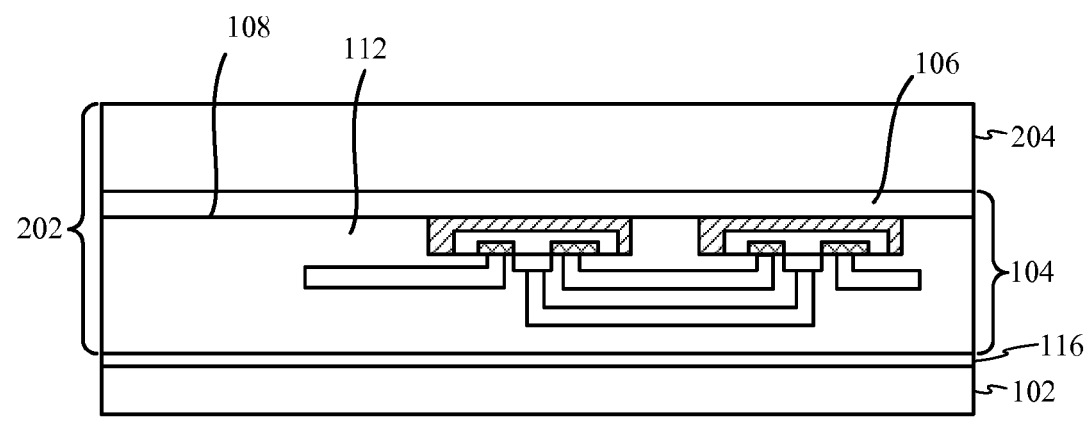
Figure 4:
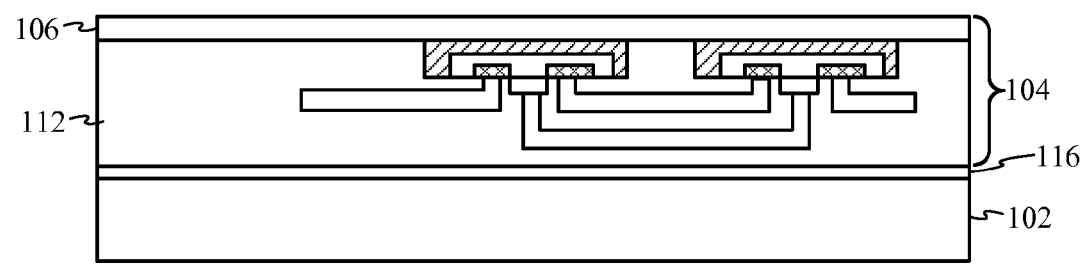
Figure 5:
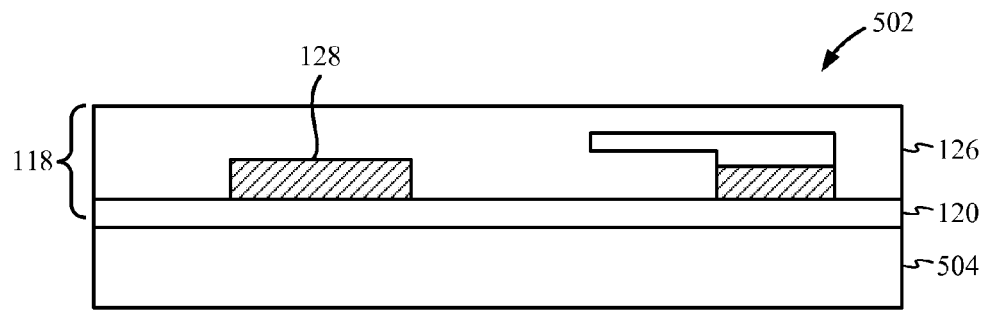
Figure 6:
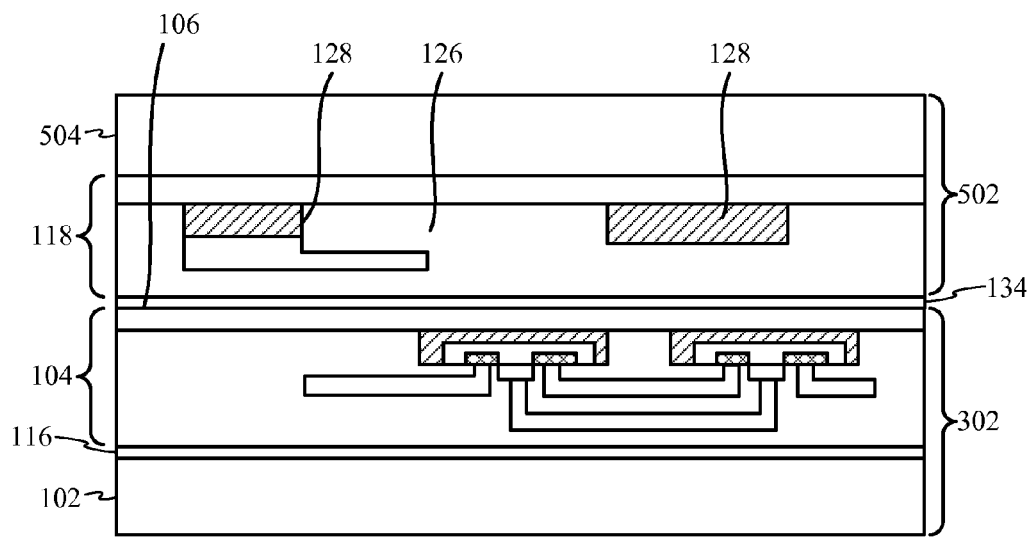
Figure 7:
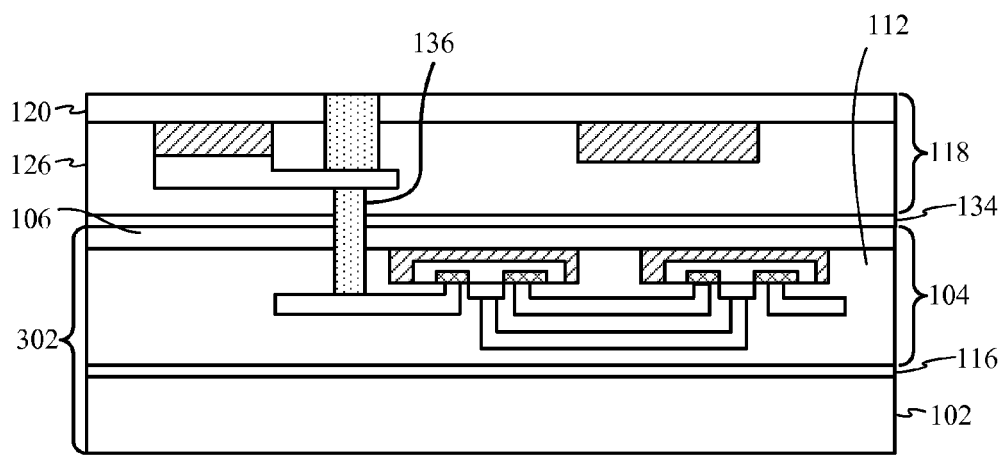

FIG. 3 shows the first stock SOI wafer 202 inverted and bonded to the sheet 102 by the first adhesive layer 116 with the first side 108 of the first insulating layer 106 facing the sheet 102, and FIG. 4 shows a first component 302 formed by the removal of the first silicon handle layer 204, for example, by chemical mechanical polishing (CMP) or other suitable process for selectively removing a desired amount of the first silicon handle layer 204. FIG. 5 illustrates a second stock SOI wafer 502 that comprises a second silicon substrate or handle layer 504 on which the second insulating layer 120 and the second circuit layer 126 are formed. FIG. 6 shows the second stock SOI wafer 502 inverted and attached to the first component 302 with the second circuit layer 126 of the second stock SOI wafer 502 bonded to the first insulating layer 106 by the second adhesive layer 134. FIG. 7 shows a second component 702 comprising the combination of the second stock SOI wafer 502 and the first component 302 with the second silicon handle layer 504 of the second stock SOI wafer 502 removed by CMP or other suitable process. The vias 136 are also formed in the second component 702, and the addition of the metal contacts 140 and other Back-End-of-the-Line (BEOL) components (including passives, MEMS, sensors and other) results in the chipset 100 of FIG. 1.

Figure 8:
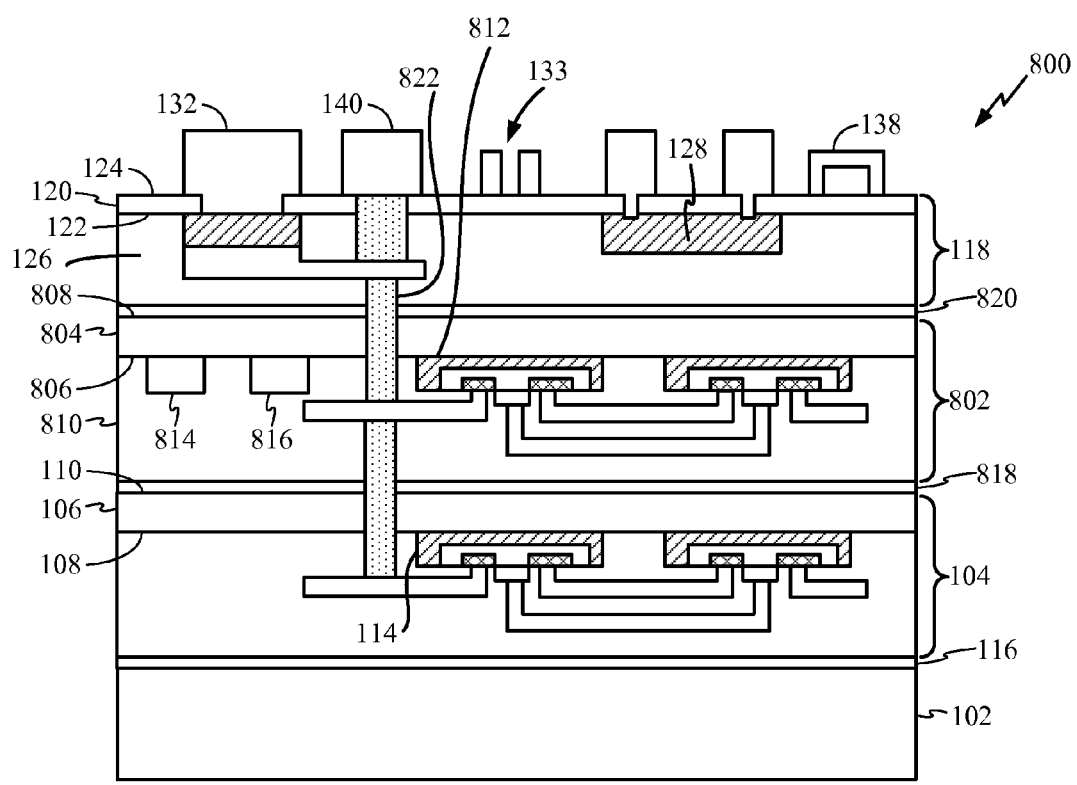
FIG. 8 is a schematic side elevational view of a chipset according to another embodiment.

FIG. 8 illustrates another embodiment in which elements common to the first embodiment are identified with like reference numerals. FIG. 8 illustrates a second chipset 800 that includes the sheet 102, the first SOI wafer 104 and the second SOI wafer 118 with the first SOI wafer 104 and the second SOI wafer 118 spaced apart by a third SOI wafer 802. The third SOI wafer 802 comprises a third substrate layer or insulating layer 804 having a first side 806 and a second side 808, and a third circuit layer 810 comprising a plurality of circuit element on the first side 806 of the third insulating layer 804, which circuit elements may include analog circuitry 814 and/or RF components 816. The third SOI wafer 802 is attached to the second side 110 of the first SOI wafer 104 with a second adhesive layer 818 so that the first side 806 of the third SOI wafer 802 faces the second side 110 of the first SOI wafer 104. The second SOI wafer 118 is attached to the second side 808 of the third SOI wafer 802 by a third adhesive layer 820 such that the first side of the second SOI wafer 118 faces the second side 808 of the third SOI wafer 802. All three of the first SOI wafer 104, the second SOI wafer 118 and the third SOI wafer 802 have substantially the same surface areas. Vias 822 connect circuit components of the first circuit layer 112, the second circuit layer 126 and the third circuit layer 810, and metal contacts 140 provides connections to elements outside the second chipset 800. This arrangement allows for the analog circuitry 814 and/or the RF components 816 to be included in the same chipset as the digital circuit elements 114 and the passives, such as capacitor 132 and provides a vertically integrated chipset that performs many conventional functions in a compact package.

While the sheet 102 has been described as comprising glass, sapphire or quartz, the use of glass for the sheet 102 may be particularly beneficial in some situations. First, it generally has a lower cost than sapphire or quartz. Next, it also has a much lower dielectric constant than sapphire, which significantly reduces the parasitic capacitance from the substrate. Finally, the wafer/panel size of glass can be much larger than sapphire and quartz, and this may allow for larger scale mass production and lower unit cost.

The chipsets of the disclosed embodiments may be integrated into one or more semiconductor dies or integrated into a device such as a set top box, a music player, a video player, an entertainment unit, a navigation device, a communications device, a personal digital assistant (PDA), a fixed location data unit, and a computer.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
   a layer of glass, quartz or sapphire;
   a first silicon-on-insulator (SOI) structure comprising a first insulating layer and at least one first circuit layer formed on a first side of the first insulating layer, the first SOI structure being bonded to the layer of glass, quartz or sapphire such that the at least one first circuit layer is located between the first insulating layer and the layer of glass, quartz or sapphire, wherein the first insulating layer comprises a second side opposite the first side of the first insulating layer;
   an adhesive layer disposed between the layer of glass, quartz or sapphire and the first SOI structure such that the at least one first circuit layer of the first SOI structure is bonded directly to the layer of glass, quartz or sapphire using the adhesive layer; and
   a second SOI structure comprising a second insulating layer and at least one second circuit layer, wherein the second insulating layer comprises a first side and a second side, the first side of the second insulating layer facing the second side of the first insulating layer and the second side of the second insulating layer is opposite the first side of the second insulating layer, wherein the at least one second circuit layer comprises at least one first passive circuit element formed on and in direct contact with the first side of the second insulating layer and at least one second passive circuit element formed on and in direct contact with the second side of the second insulating layer, the second SOI structure being bonded to the first insulating layer such that the at least one first passive circuit element is located between the second insulating layer and the first insulating layer, wherein the second side of the first insulating layer is bonded to the at least one second circuit layer.

2. The apparatus of claim 1, wherein the at least one first circuit layer comprises a plurality of CMOS transistors.

3. The apparatus of claim 1, wherein the at least one second passive circuit element comprises at least one microelectromechanical system (MEMS) element.

4. The apparatus of claim 1, wherein the at least one second passive circuit element comprises at least one sensor.

5. The apparatus of claim 1, further comprising a second adhesive layer disposed between the first SOI structure and the second SOI structure such that the second side of the first insulating layer is bonded directly to the at least one second circuit layer using the second adhesive layer.

6. The apparatus of claim 1 integrated into at least one semiconductor die.

7. The apparatus of claim 1 integrated into a device selected from the group consisting of a set top box, a music player, a video player, an entertainment unit, a navigation device, a communications device, a personal digital assistant (PDA), a fixed location data unit, and a computer.

8. The apparatus of claim 1,
wherein the at least one first circuit layer comprises a plurality of complementary metal oxide semiconductor (CMOS) transistors,
wherein the at least one second circuit layer comprises or supports at least one passive component or at least one MEMS element,
wherein the first SOI structure is bonded directly to the layer of glass, quartz or sapphire, and
wherein the second SOI structure is bonded directly to the first insulating layer.

9. The apparatus of claim 1, including a third SOI structure comprising SOI and having at least one third circuit layer on a first side of a third insulating layer, the third SOI structure being connected to the first SOI structure such that the at least one third circuit layer is located between the first insulating layer and the second insulating layer.

10. The apparatus of claim 9, wherein the at least one third circuit layer comprises CMOS transistors.

11. The apparatus of claim 9, wherein the second SOI structure is bonded directly to the third SOI structure such that the at least one second circuit layer is located between the second insulating layer and the third insulating layer.

12. The apparatus of claim 9, wherein the at least one first circuit layer includes a digital circuit and the at least one third circuit layer includes an analog circuit.

13. The apparatus of claim 9, wherein the at least one first circuit layer includes a digital circuit, the at least one second circuit layer includes or supports a passive device or a MEMS element and the at least one third circuit layer includes an analog or radio frequency (RF) circuit.

14. The apparatus of claim 9, wherein a surface area of the first insulating layer is substantially equal to a surface area of the second insulating layer, and the surface area of the second insulating layer is substantially equal to a surface area of the third insulating layer.

15. An apparatus comprising:
means for supporting a first silicon-on-insulator (SOI) structure, wherein the first SOI structure comprises a first insulating layer means for insulating and at least one first circuit means for processing signals formed on a first side of the first insulating layer means, the first SOI structure being bonded to the means for supporting such that the at least one first circuit means is located between the first insulating layer means and the means for supporting, wherein the first insulating layer means comprises a second side opposite the first side of the first insulating layer means;
an adhesive layer disposed between the means for supporting and the first SOI structure such that the at least one first circuit means of the first SOI structure is bonded directly to the means for supporting using the adhesive layer; and
a second SOI structure comprising a second insulating layer means and at least one second circuit means for processing signals, wherein the second insulating layer means comprises a first side and a second side, the first side of the second insulating layer means facing the second side of the first insulating layer means and the second side of the second insulating layer means is opposite the first side of the second insulating layer means, wherein the at least one second circuit means comprises at least one first passive circuit element formed on and in direct contact with the first side of the second insulating layer means and at least one second passive circuit element formed on and in direct contact with the second side of the second insulating layer means, the second SOI structure being bonded to the first insulating layer means such that the at least one first passive circuit element is located between the second insulating layer means and the first insulating layer means, wherein the second side of the first insulating layer means is bonded to the at least one second circuit means.

16. The apparatus of claim 15, wherein the at least one first circuit means comprises a plurality of CMOS transistors.

17. The apparatus of claim 15, wherein the at least one second passive circuit element comprises at least one microelectromechanical system (MEMS) element or at least one sensor.

18. The apparatus of claim 15 integrated into at least one semiconductor die.

19. The apparatus of claim 15 integrated into a device selected from the group consisting of a set top box, a music player, a video player, an entertainment unit, a navigation device, a communications device, a personal digital assistant (PDA), a fixed location data unit, and a computer.

20. The apparatus of claim 15,
wherein the at least one first circuit means comprises a plurality of CMOS transistors,
wherein the at least one second circuit means comprises or supports at least one passive component or at least one MEMS element,
wherein the first SOI structure is bonded directly to the means for supporting, and
wherein the second SOI structure is bonded directly to the first insulating layer means.

21. The apparatus of claim 15, wherein the means for supporting comprises a layer of glass or a layer of quartz or a layer of sapphire.

22. The apparatus of claim 1, wherein the at least one first circuit layer comprises a plurality of CMOS transistors and wherein the at least one second circuit layer comprises at least one high-Q passive element.

23. The apparatus of claim 1, wherein the at least one first circuit layer comprises a plurality of CMOS transistors and wherein the at least one second circuit layer comprises at least one semiconductor varactor.

24. The apparatus of claim 1, wherein the at least one first circuit layer comprises a plurality of CMOS transistors and wherein the at least one second circuit layer comprises at least one MEMS tunable capacitor.

25. The apparatus of claim 1, wherein the at least one first circuit layer comprises a plurality of CMOS transistors and wherein the at least one second circuit layer comprises at least one radio frequency (RF) switch.

* * * * *